(12) United States Patent
Bogannam

(10) Patent No.: US 6,202,294 B1
(45) Date of Patent: Mar. 20, 2001

(54) EMI/RFI SHIELD ASSEMBLY COVER REMOVAL TOOL

(75) Inventor: Daniel C. Bogannam, Portsmouth, NH (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/160,314

(22) Filed: Sep. 25, 1998

(51) Int. Cl.⁷ .................................................. B23P 19/02
(52) U.S. Cl. .............................. 29/764; 29/758; 29/762; 29/278; 29/854; 174/35 R; 174/67
(58) Field of Search ............................. 29/764, 758, 762, 29/754, 854, 857, 278, 426.5; 174/67, 35 R, 61

(56) References Cited

U.S. PATENT DOCUMENTS

| | | | |
|---|---|---|---|
| 4,461,073 | * | 7/1984 | Harringer et al. ...................... 29/764 |
| 4,858,309 | * | 8/1989 | Korsunsky et al. .................... 29/758 |
| 4,868,975 | * | 9/1989 | Zaremba et al. ....................... 29/741 |
| 5,502,887 | * | 4/1996 | Gonzales ............................... 29/764 |

* cited by examiner

Primary Examiner—Lee Young
Assistant Examiner—A. Dexter Tugbang
(74) Attorney, Agent, or Firm—David L. Davis

(57) ABSTRACT

A tool for removing an EMI/RFI shield assembly cover. The tool includes two body members arranged for reciprocating movement toward and away from each other over a limited distance. Each body member has a gripper member extending outwardly therefrom which, when the body members are spaced apart, slide over opposed sides of the shield cover. When the body members are subsequently moved together, the gripper members engage edges of the opposed sides of the cover so that subsequent movement of the tool removes the cover from the base.

5 Claims, 3 Drawing Sheets

EMI/RFI SHIELD ASSEMBLY COVER REMOVAL TOOL

BACKGROUND OF THE INVENTION

This invention relates to electromagnetic interference/radio frequency interference (EMI/RFI) shield assemblies for circuit boards and, more particularly, to a tool for removing the cover from such a shield assembly to expose the protected circuitry without damaging the shield assembly.

There are numerous applications where electronic circuit components mounted to a printed circuit board must be shielded from electromagnetic interference and/or radio frequency interference. To provide such shielding, metallic shielding assemblies have been developed which cover a group of electronic circuit components mounted to the printed circuit board, with the shield assembly being physically secured in some manner to the printed circuit board while also being grounded thereto. One such shield assembly includes a metallic base and a metallic cover. The base is a rectilinear box having an open side which is secured to the circuit board with the open side adjacent the circuit board, the box enclosing the electronic circuit components. The securing of the box to the circuit board is by using solder to surface mount the box to the board. In order to gain access to the electronic circuit components without removing the shield, the side of the box opposite the circuit board has an enlarged opening therein. This opening is then shielded by the cover, which itself is a metallic rectilinear box having an open side and which fits snugly around the base with the open side of the cover facing the circuit board. When it is desired to gain access to the shielded electronic circuit components, the cover must be removed from the base. In the past, this has presented a problem, since there is no known tool for removing the cover without causing damage to the shield assembly. It would therefore be desirable to provide such a tool.

SUMMARY OF THE INVENTION

According to the present invention, there is provided a tool for removing such a shield cover from the shield base. The inventive tool includes a pair of gripper members each secured to a respective body member. The body members are held together with a slight separation therebetween and are movable toward and away from each other. In use, the tool is placed over the shield cover and the body members are moved toward the circuit board. The body members are then moved toward each other so that the gripper members are under the edges of opposed sides of the cover. The tool is then lifted away from the circuit board, taking the cover with it.

In accordance with an aspect of this invention, a spring is positioned between the body members to resiliently bias them apart.

BRIEF DESCRIPTION OF THE DRAWINGS

The foregoing will be more readily apparent upon reading the following description in conjunction with the drawings in which like elements in different figures thereof are identified by the same reference numeral and wherein.

DETAILED DESCRIPTION

Figure 1:
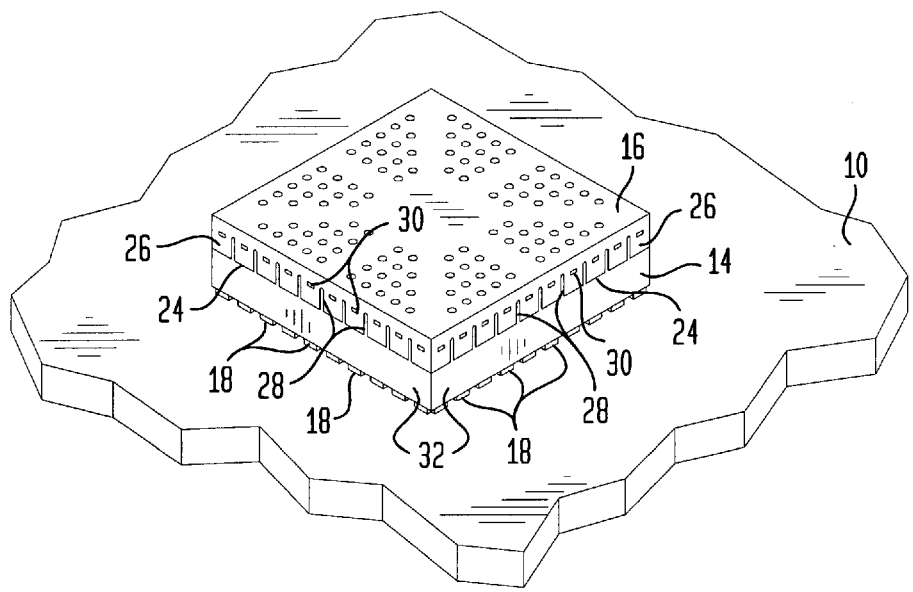
FIG. 1 is a perspective view of a circuit board showing a shield assembly with which the inventive tool may be used.
Figure 2:
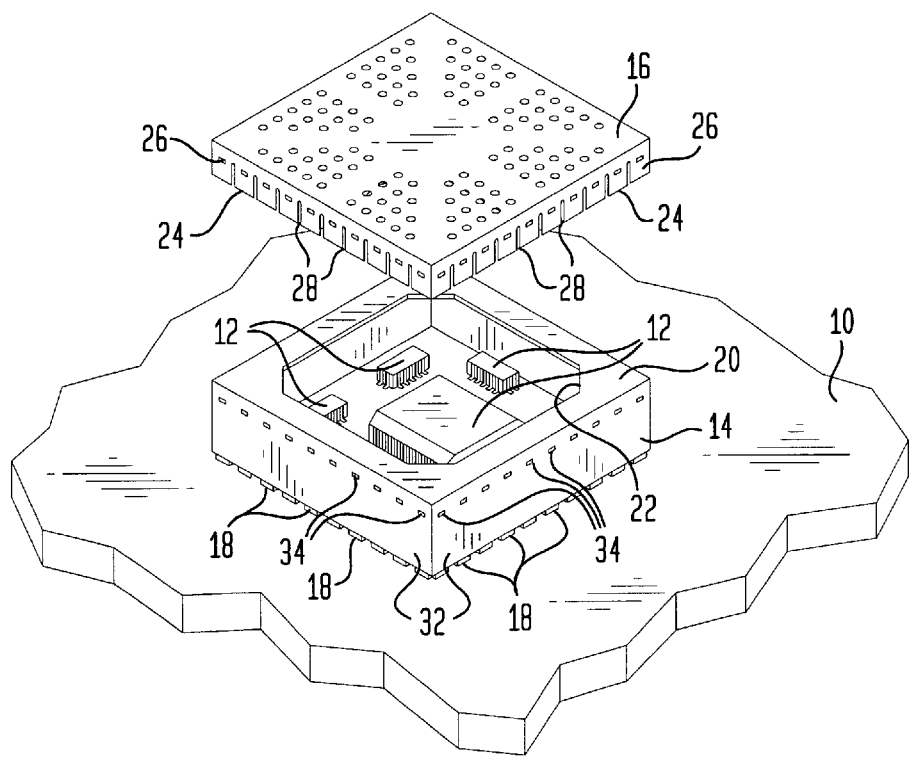
FIG. 2 is a view similar to FIG. 1 showing the cover separated from the base.

FIGS. 1 and 2 show a printed circuit board 10 with electronic components 12 mounted thereon. A shield assembly including a base 14 and a cover 16 encloses the components 12 and shields them from electromagnetic and radio frequency interference. Thus, the base 14 is a metallic rectilinear box having an open side. The base 14 is secured to the circuit board 10 by being surface mounted to surface mount solder pads 18, as is known in the art. This securement places the open side of the base 14 against the circuit board 10. The side 20 of the base 14 which is opposite the circuit board 10 is formed with an enlaced opening 22 to provide access to the shielded components 12.

The cover 16 is a metallic rectilinear box having an open side. The cover 16, like the base 14, has an open side defined by distal edges 24 of lateral sides 26. The lateral sides 26 of the cover 16 are sized so that the cover 16 fits snugly around the base 14. To assist in providing and maintaining a snug fit, the lateral sides 26 are formed with slits 28 and small openings 30 between the slits 28, and the lateral sides 32 of the base 14 are formed with outwardly extending bumps 34 corresponding in location to the openings 30. The openings 30 and bumps 34 act as detents when the cover 16 is installed on the base 14. The lateral sides 26 of the cover 16 are dimensioned so that when the cover 16 is installed on the base 14, there is a gap between the distal edges 24 and the surface of the circuit board 10, as best shown in FIG. 1.

Figure 3:
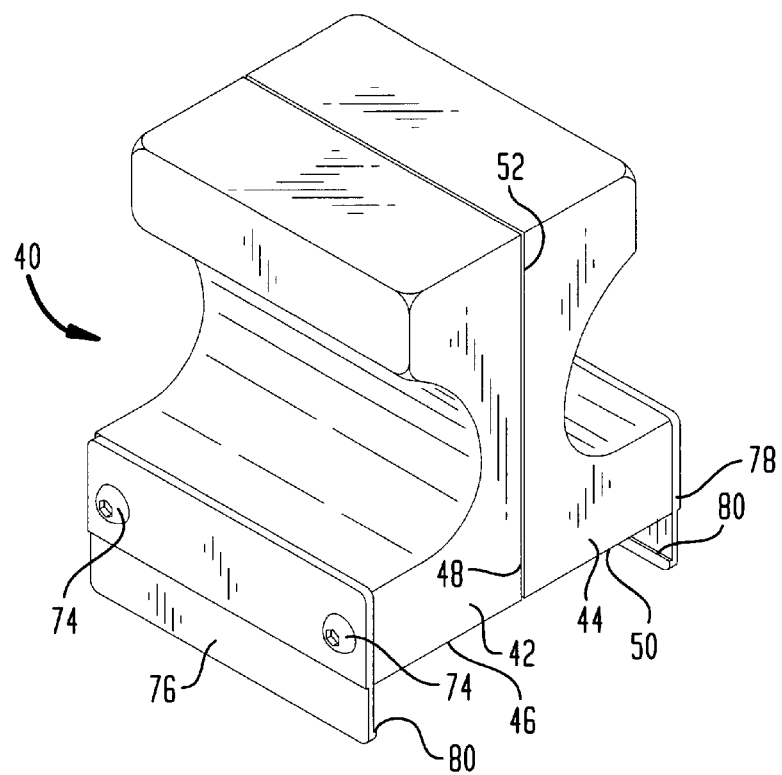
FIG. 3 is a perspective view of a tool constructed according to the present invention.
Figure 4:
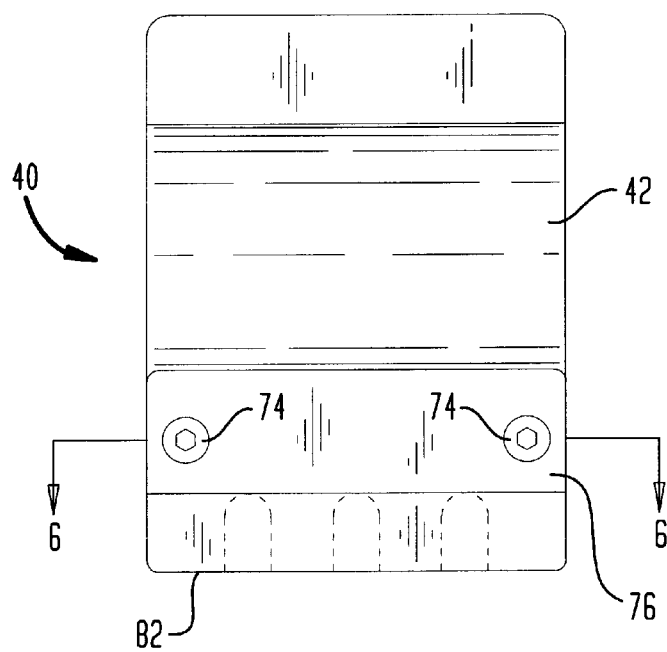
FIG. 4 is a front elevational view of the tool shown in FIG. 3.
Figure 5:
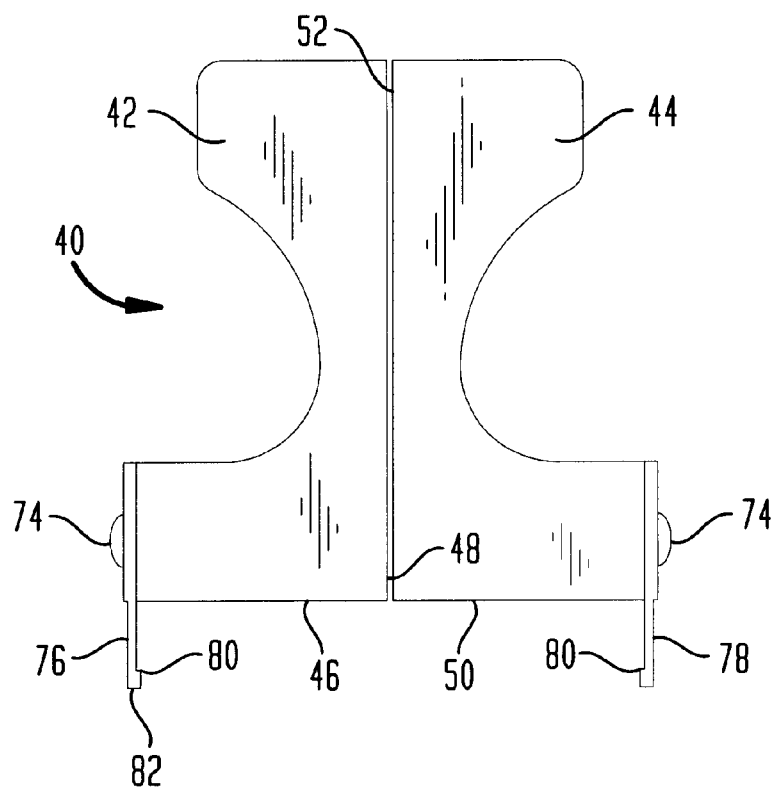
FIG. 5 is a side elevational view of the tool shown in FIG. 3.
Figure 6:
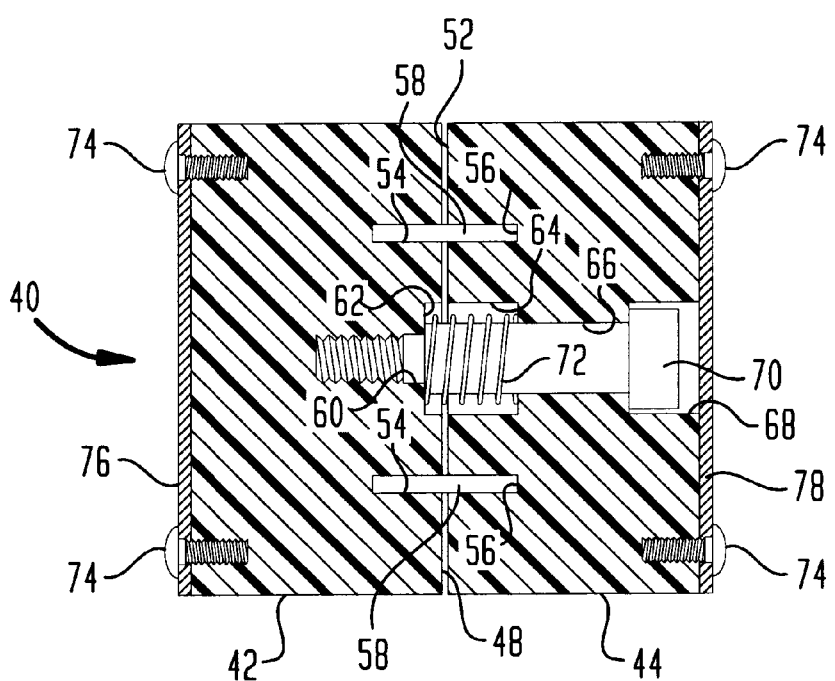
FIG. 6 is a cross sectional view taken along the line 6—6 in FIG. 4.

Referring now to FIGS. 3–6, the inventive tool, designated generally by the reference numeral 40, includes a first body member 42 and a second body member 44. The first body member 42 has a front face 46 and a mating face 48. Similarly, the second body member 44 has a front face 50 and a mating face 52. Preferably, the faces 46, 48, 50, 52 are all substantially planar. As best shown in FIG. 6, the body member 42 is formed with a pair of spaced bores 54 extending therein from the mating face 48 and orthogonal thereto. Similarly, the body member 44 is formed with a pair of spaced bores 56 extending therein from the mating face 52 and orthogonal thereto. The bores 54, 56 are spaced the same distance from the front faces 36, 50, respectively, and are equally spaced from the side walls of the body members 42, 44 so that when the body members 42, 44 are aligned, as shown in FIG. 3, the bores 54 are aligned with the bores 56. A pin 58 is installed in each bore pair 54, 56 to act as a guide member which orients the body members 42, 44 with respect to each other so that the mating faces 48, 52 face each other while at the same time allowing the body members 42, 44 to move relative to each other along a line of movement orthogonal to the mating faces 48, 52. Each pin 58 must be free to move in at least one of the corresponding bores 54, 56.

As shown in FIG. 6, the first body member 42 is formed with a bore 60 extending therein from the mating face 40 along an axis parallel to the line of movement, with the distal (innermost) end of the bore 60 being internally threaded. The bore 60 has an enlarged region 62 open to the mating face 48. The second body member 44 is formed with a bore therethrough coaxial with the bore 60. The bore through the second body member 44 includes an enlarged region 64 open to the mating face 52, a central region 66, and a further enlarged region 68 open at the side of the body member 44 opposite the mating face 52. A shoulder screw 70 extends through the bore of the second body member 44 and is threadedly secured in the bore 60 of the first body member 42. A helical spring 72 surrounds the shoulder screw 70 within the enlarged regions 62, 64. Thus, the spring 72 provides a force to yieldably bias the body members 42, 44 away from each other along the line of movement and the head of the shoulder screw 70 abuts against the inner wall of the enlarged region 68 to provide an upper limit on the separation between the mating faces 48, 52.

Secured to the first body member 42, as by screws 74, is a gripper member 76. Similarly, a gripper member 78 is secured to the body member 44, as by screws 74. The gripper members 76, 78 are identical and therefore only the gripper member 76 will be described in detail. As shown, the gripper member 76 is substantially planar and is secured to its body member 42 on the side opposite the mating face 48. The gripper member 76 extends in a plane forwardly beyond the front face 46 to a shoulder 80 formed on the gripper member 76 on the side facing the gripper member 78. The shoulder 80 extends along the length of the gripper member 76 parallel to the front face 46 and is spaced from the front face 46 by a distance at least as great as the dimension of the shield cover 16 lateral side 26 orthogonally to the distal edge 24. The distance from the shoulder 80 to the distal end 82 of the gripper member 76, which distal end 82 runs parallel to the shoulder 80, is less than the gap between the distal edge 24 of the cover 16 and the circuit board 10 when the cover 16 is installed on the base 14. As shown, the planes of the gripper members 76, 78 are parallel to each other with the shoulders 80 of the gripper members 76, 80 facing each other and being aligned along a line parallel to the line of movement.

The body members 42, 44 are dimensioned so that they can be separated sufficiently that the gripper members 76, 78 can be moved along opposed lateral sides 26 of the cover 16 toward the circuit board until the shoulders 80 pass the distal edges 24. The body members 42, 44 can then be moved toward each other against the force of the spring 72 until the shoulders 80 are separated by a distance less than the distance between the opposed lateral sides 26 of the cover 16. Accordingly, subsequent movement of the tool 40 away from the circuit board 10 causes the shoulders 80 to engage the distal edges 24 to remove the cover 16 from the base 14. This removal does not cause any damage to either the base 14 or the cover 16 since all forces are applied over a relatively large area without deforming either the base 14 or the cover 16.

Accordingly, there has been disclosed an improved tool for removing the cover from an EMI/RFI shield assembly. While an illustrative embodiment of the present invention has been disclosed herein, it is understood that various modifications and adaptations to the disclosed embodiment will be apparent to one of ordinary skill in the art and it is therefore intended that this invention be limited only by the scope of the appended claims.

What is claimed is:

1. In combination:
   a circuit board;
   an EMI/RFI shield base secured to said circuit board, said shield base being a metallic rectilinear box having an open side and being secured to said circuit board with said open side adjacent said circuit board;
   an EMI/RFI shield cover, said shield cover being a metallic rectilinear box having an open side and adapted to fit snugly around said shield base with said shield cover open side facing said circuit board and wherein the shield cover lateral side distal edges which define said shield cover open side are spaced a predetermined distance from said circuit board; and
   a tool for removing the shield cover from the shield base, the tool comprising:
      first and second body members each having a front face and a mating face;
      at least one guide member cooperating with said first and second body members to orient said first and second body members with respect to each other so that the mating faces face each other and to allow said first and second body members to move toward and away from each other along a line of movement transverse to the mating faces; and
      first and second gripper members each secured to a respective one of said first and second body members and spaced from the respective mating face, each of said gripper members extending in a plane forwardly beyond the respective body member front face to a shoulder formed on said each gripper member, each said shoulder extending toward the shoulder of the other gripper member and each said shoulder being spaced from the respective body member front face by a distance at least as great as each shield cover lateral side dimension orthogonal to its distal edge, and wherein the distance from each said shoulder to the distal end of the respective gripper member is less than the predetermined distance separating the shield cover lateral side distal edges from the circuit board, the planes of said first and second gripper members being parallel to each other with the shoulders of said first and second gripper members being aligned along a line parallel to said line of movement;
   wherein said first and second body members of said tool are dimensioned so that said first and second body members can be separated sufficiently to allow said first and second gripper members to be moved along opposed lateral sides of said shield cover toward said circuit board until said shoulders pass said lateral side distal edges, and then said first and second body members are movable toward each other until said shoulders are separated by a distance less than the distance between said opposed lateral sides;
   whereby subsequent movement of said tool away from said circuit board causes said shoulders to engage said lateral side distal edges to remove said shield cover from said shield base.

2. The tool according to claim 1 further comprising:
   a resilient member supported between said first and second body members and bearing against each of said first and second body members to yieldably bias said first and second body members away from each other along said line of movement; and
   a stop member arranged to provide an upper limit on the separation between said first and second body member mating faces.

3. The tool according to claim 2 wherein:
   said first body member is formed with a first bore extending into said first body member from said first body member mating face along a first axis parallel to said line of movement, said first bore having an enlarged region open to said first body member mating face;
   said second body member is formed with a second bore extending through said second body member along a second axis coaxial with said first axis, said second bore having a first enlarged region open to said second body member mating face at a first end of said second bore, a central region, and a second enlarged region open at a second end of said second bore; and said stop member includes an elongated member extending through said second bore with clearance and secured in said first bore, said elongated member having an enlarged portion situated in said second bore second enlarged region and dimensioned so that it cannot enter said second bore central region.

4. The tool according to claim 3 wherein said resilient member includes a helical spring member surrounding said elongated member, said helical spring having a first end in said first body member first bore enlarged region and a second end in said second body member second bore first enlarged region.

5. The tool according to claim 1 wherein:

said first body member is formed with at least one first bore extending into said first body member from said first body member mating face along at least one first axis parallel to said line of movement;

said second body member is formed with at least one second bore extending into said second body member from said second body member mating face along at least one second axis coaxial with a respective one of said first body member at least one first bore; and said at least one guide member includes at least one pin extending into a respective one of said first body member at least one first bore and extending with clearance into a respective one of said second body member at least one second bore.

* * * * *